US008158516B2

(12) United States Patent
Kuniya

(10) Patent No.: US 8,158,516 B2
(45) Date of Patent: Apr. 17, 2012

(54) METHOD FOR MANUFACTURING SEMICONDUCTOR DEVICE

(75) Inventor: Takuji Kuniya, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/017,630

(22) Filed: Jan. 31, 2011

(65) Prior Publication Data
US 2011/0217822 A1 Sep. 8, 2011

(30) Foreign Application Priority Data

Mar. 5, 2010 (JP) .................. 2010-049419

(51) Int. Cl.
*H01L 21/44* (2006.01)
(52) U.S. Cl. ........ 438/672; 438/637; 438/638; 438/673; 438/700
(58) Field of Classification Search .......... 438/257–258, 438/593, 612–624, 637–638, 672–673, 700
See application file for complete search history.

(56) References Cited

U.S. PATENT DOCUMENTS

2009/0283739 A1 11/2009 Kiyotoshi
2010/0301481 A1* 12/2010 Furusawa et al. ............. 257/751

FOREIGN PATENT DOCUMENTS

JP 2000-21815 1/2000
* cited by examiner

*Primary Examiner* — Dung A. Le
(74) *Attorney, Agent, or Firm* — Oblon, Spivak, McClelland, Maier & Neustadt, L.L.P.

(57) ABSTRACT

According to one embodiment, a method is described for manufacturing a semiconductor device. The method can form a conductive layer including tungsten on a foundation layer. The method can form a trench by selectively etching the conductive layer. The trench is shallower than a depth from a surface of the conductive layer to the foundation layer. The method can form a protective film on a side surface and a bottom surface of the conductive layer in the trench using a gas containing bromine. The protective film includes a compound of the tungsten and the bromine. The method can remove the protective film on the bottom surface of the conductive layer. The method can etch a portion of the conductive layer below the trench with the protective film on the side surface of the conductive layer.

20 Claims, 9 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2010-049419, filed on Mar. 5, 2010; the entire contents of which are incorporated herein by reference.

FIELD

Embodiments described herein relate generally to a method for manufacturing a semiconductor device.

BACKGROUND

Resistance change memory and phase change memory are expected to serve as new nonvolatile memory. For instance, US 2009/0283739 proposes a stacked structure of a plurality of component memory layers, each including a word line, a bit line, and a resistance change element as a recording layer sandwiched between the word line and the bit line. US 2009/0283739 further discloses use of tungsten for the word line and the bit line.

In such nonvolatile memory, tungsten used for the word line and the bit line, and the resistance change material are etched so that the recording layer is generally located at the cross-point of the word line and the bit line.

DETAILED DESCRIPTION

According to one embodiment, a method is described for manufacturing a semiconductor device. The method can form a conductive layer including tungsten on a foundation layer. The method can form a trench by selectively etching the conductive layer. The trench is shallower than a depth from a surface of the conductive layer to the foundation layer. After the forming of the trench, the method can form a protective film on a side surface and a bottom surface of the conductive layer in the trench using a gas containing bromine. The protective film includes a compound of the tungsten and the bromine. The method can remove the protective film on the bottom surface of the conductive layer. After the removing of the protective film on the bottom surface of the conductive layer, the method can etch a portion of the conductive layer below the trench with the protective film on the side surface of the conductive layer.

Embodiments will now be described with reference to the drawings.

Figure 1A:
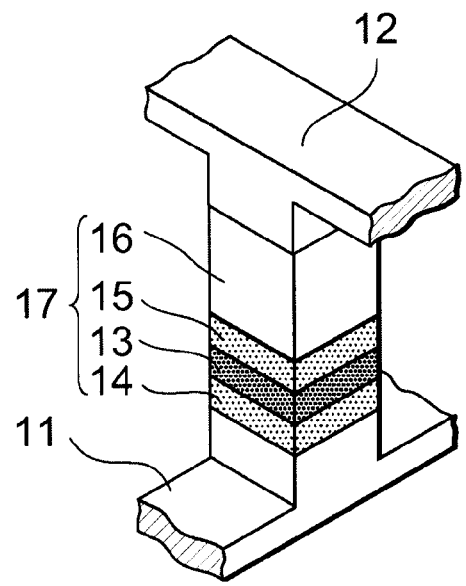
FIGS. 1A and 1B are schematic perspective views of the relevant part of a semiconductor device according to an embodiment.

FIG. 1A is a schematic perspective view illustrating the structure of the relevant part of a semiconductor device according to an embodiment.

Figure 1B:
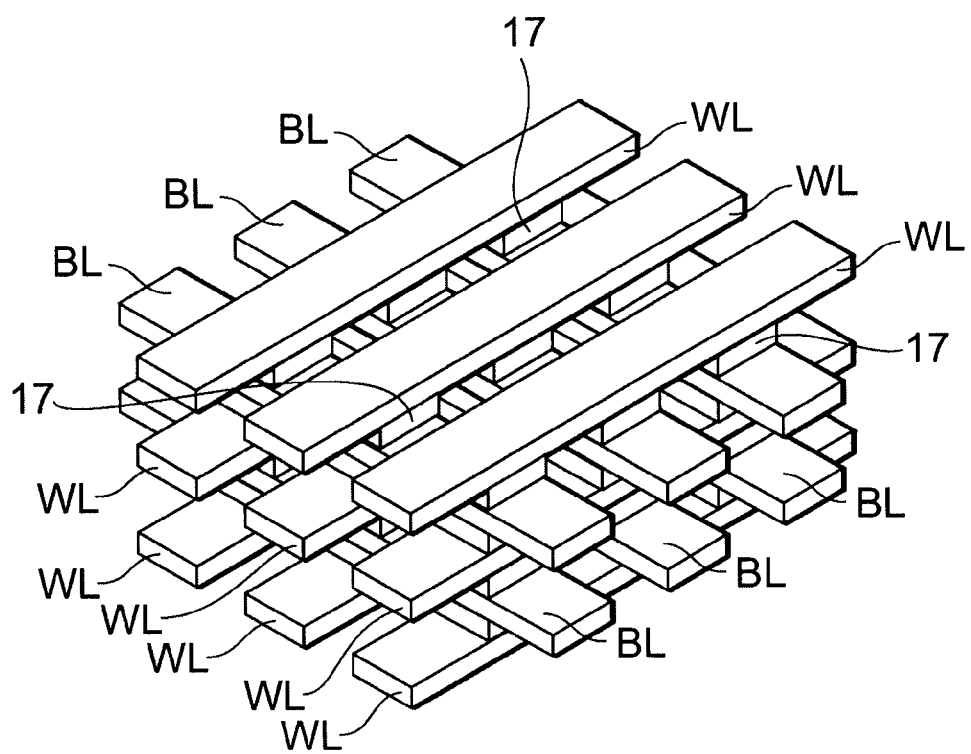

The semiconductor device according to this embodiment includes a first electrode 11, a second electrode 12 three-dimensionally crossing the first electrode 11, and a stacked structure 17. The stacked structure 17 is sandwiched between the first electrode 11 and the second electrode 12 and including a recording layer (a resistance change layer or a phase change layer) 13. These constitute a component memory layer, and a plurality of component memory layers are stacked as shown in FIG. 1B. The number of component memory layers stacked is arbitrary.

The first electrode 11 in FIG. 1A corresponds to a word line WL in FIG. 1B, and the second electrode 12 in FIG. 1A corresponds to a bit line BL in FIG. 1B. Alternatively, the first electrode 11 corresponds to the bit line BL, and the second electrode 12 corresponds to the word line WL. The number of word lines WL and the number of bit lines BL are arbitrary.

At each cross-point where the word line WL crosses the bit line BL, the stacked structure 17 including the recording layer 13 is provided. The stacked structure 17 includes e.g. a recording layer 13, a first barrier metal 14, a second barrier metal 15, and a rectifying element (e.g., diode) 16. The recording layer 13 is provided between the first barrier metal 14 and the second barrier metal 15.

The semiconductor device according to this embodiment is a nonvolatile memory device. For instance, the recording layer 13 can be a resistance change layer. In this case, the resistance of the resistance change layer can be changed by applying a voltage to the resistance change layer through the first electrode 11 and the second electrode 12. Even if the application of a voltage is subsequently stopped, one of the two stable states, i.e., a high resistance state and a low resistance state, is maintained. Each state corresponds to data "0" or "1". In the case where the recording layer 13 is a phase change layer, the crystalline state of the phase change layer is controlled by application of a voltage.

Next, with reference to FIG. 2A to FIG. 6, a method for manufacturing a semiconductor device according to this embodiment is described. In each of these figures, the left illustration shows a cross-sectional view cut along a plane perpendicular to the extending direction of the bit line BL, and the right illustration shows a cross-sectional view cut along a plane perpendicular to the extending direction of the word line WL.

Figure 2A:
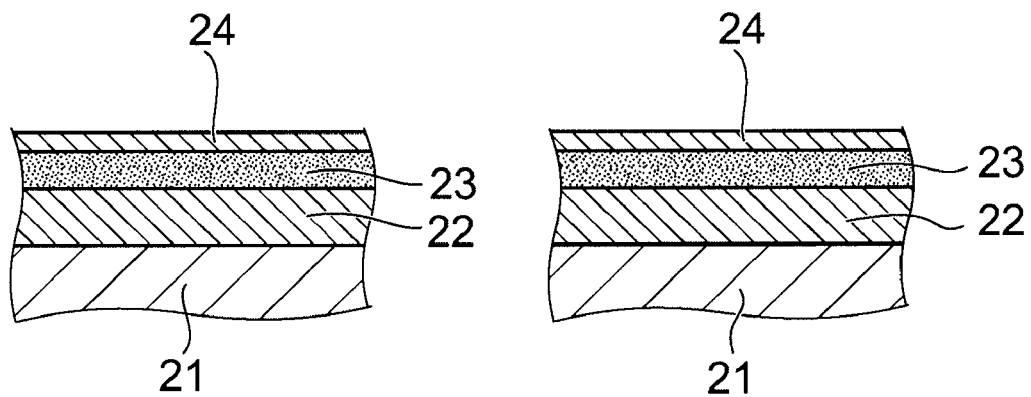
FIG. 2A to FIG. 10C are schematic cross-sectional views showing a method for manufacturing the semiconductor device according to the embodiment.

First, as shown in FIG. 2A, a conductive layer 22, an intermediate layer 23, and a conductive layer 24 are sequentially formed on a foundation layer 21. The conductive layer 22 is a tungsten layer and constitutes a word line WL. In this specification, the tungsten layer is not limited to a layer consisting only of tungsten, but also includes an alloy layer and a compound layer primarily composed of tungsten. The intermediate layer 23 corresponds to the stacked structure 17 including the recording layer 13. The conductive layer 24 is a tungsten layer and constitutes part of a bit line BL.

Figure 2B:
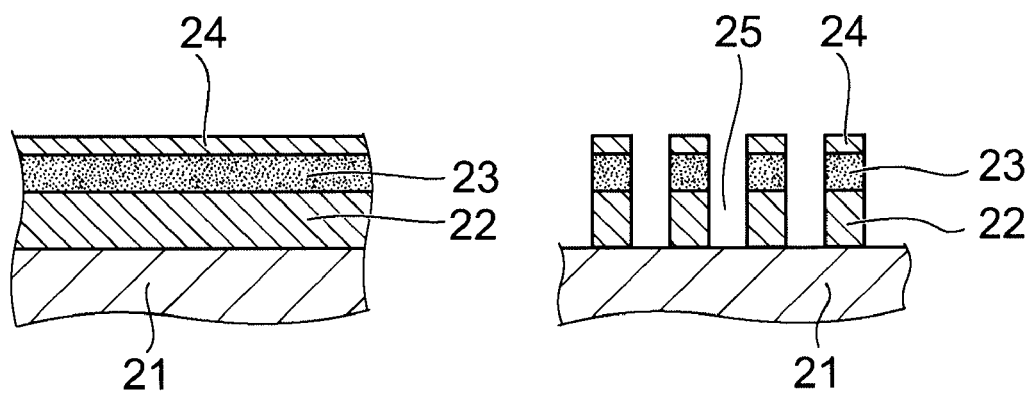

The right illustration of FIG. 2B shows a cross section cut along a plane perpendicular to the extending direction of the word line WL. As shown therein, a trench 25 is formed in the first stacked body of the conductive layer 22, the intermediate layer 23, and the conductive layer 24 by e.g. the reactive ion etching (RIE) method. The trench 25 reaches the foundation layer 21. On the foundation layer 21, the first stacked body of the conductive layer 22, the intermediate layer 23, and the conductive layer 24 is divided into a plurality by the trench 25 in the extending direction of the bit line BL (the direction crossing the extending direction of the conductive layer 22 constituting the word line WL).

Figure 3A:
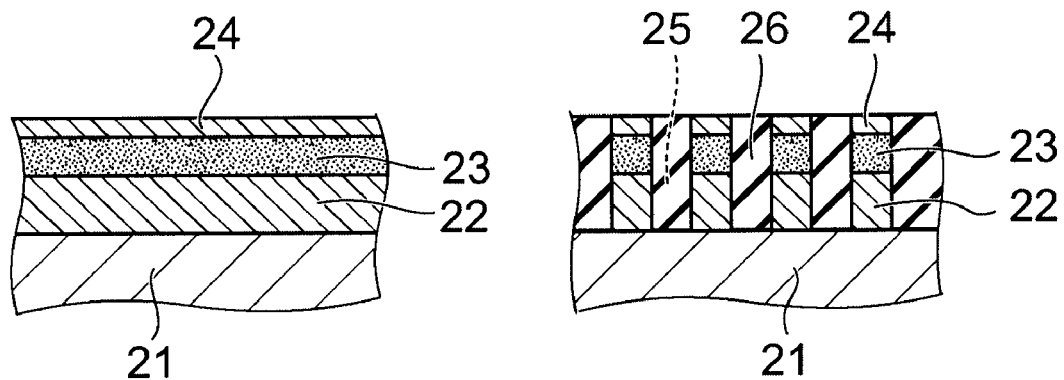

Next, as shown in the right illustration of FIG. 3A, an interlayer insulating film 26 is buried in the trench 25 and planarized. The upper surface of the conductive layer 24 is exposed from the interlayer insulating film 26.

Figure 3B:
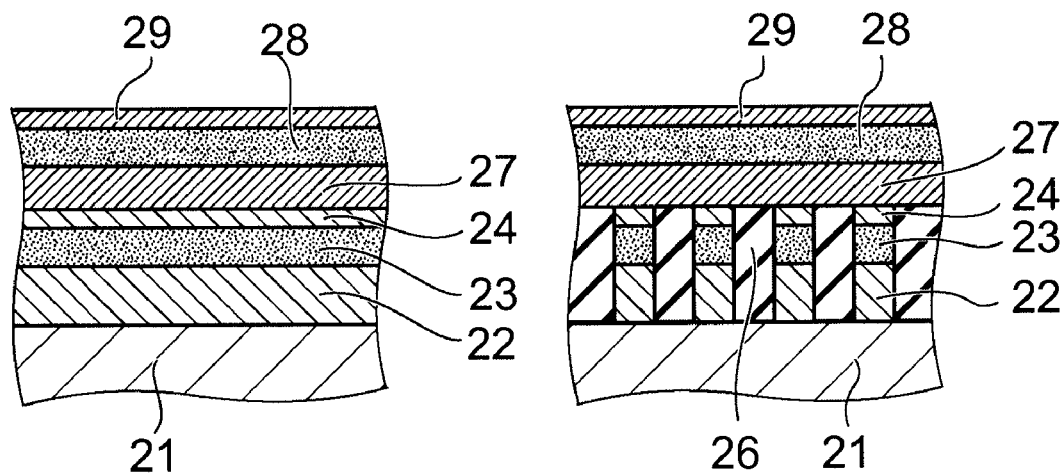

Next, as shown in FIG. 3B, a conductive layer 27, an intermediate layer 28, and a conductive layer 29 are sequentially formed on the conductive layer 24 and the interlayer insulating film 26. That is, a second stacked body including the conductive layer 27, the intermediate layer 28, and the conductive layer 29 is formed on the first stacked body including the conductive layer 22, the intermediate layer 23, and the conductive layer 24. The conductive layer 27 is a tungsten layer and constitutes the bit line BL in conjunction with the conductive layer 24. The intermediate layer 28 corresponds to the stacked structure 17 including the recording layer 13. The conductive layer 29 is a tungsten layer and constitutes part of a word line WL.

Figure 4A:
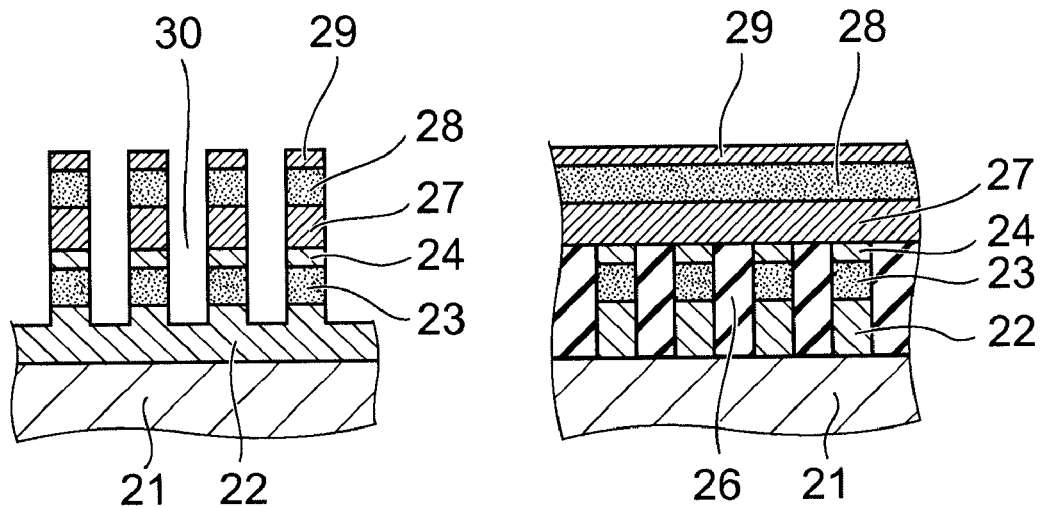

The left illustration of FIG. 4A shows a cross section cut along a plane perpendicular to the extending direction of the bit line BL. As shown therein, a trench 30 is formed in the second stacked body (the conductive layer 29, the intermediate layer 28, and the conductive layer 27) and the first stacked body (the conductive layer 24, the intermediate layer 23, and the conductive layer 22) by e.g. the RIE method. The trench 30 reaches the conductive layer 22, and a portion of the conductive layer 22 on the surface side is also processed. By the trench 30, the second stacked body (the conductive layer 29, the intermediate layer 28, and the conductive layer 27) is divided into a plurality in the extending direction of the word line WL (the extending direction of the conductive layer 22), and the first stacked body (the conductive layer 24, the intermediate layer 23, and the conductive layer 22) is divided in a columnar shape.

Figure 4B:
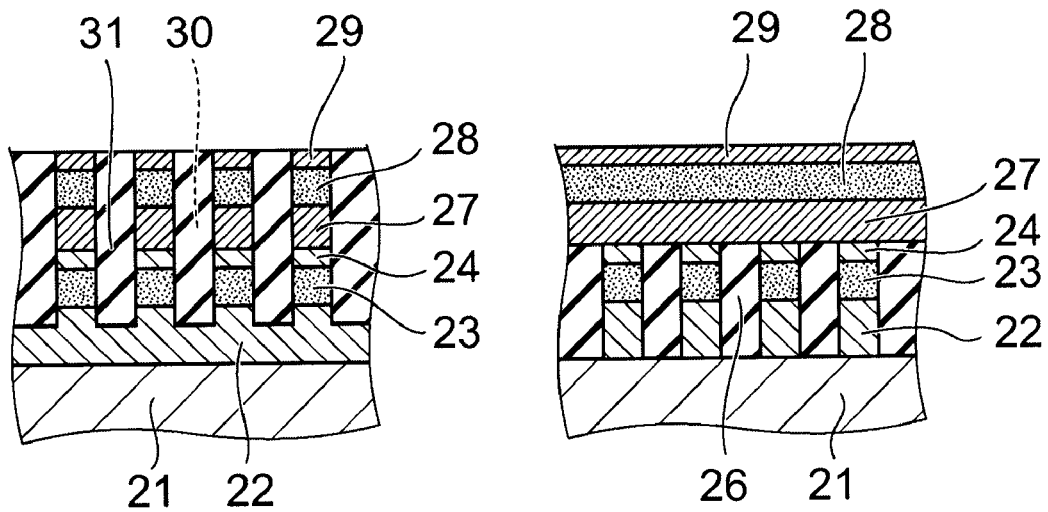

Next, as shown in the left illustration of FIG. 4B, an interlayer insulating film 31 is buried in the trench 30 and planarized. The upper surface of the conductive layer 29 is exposed from the interlayer insulating film 31.

Figure 5A:
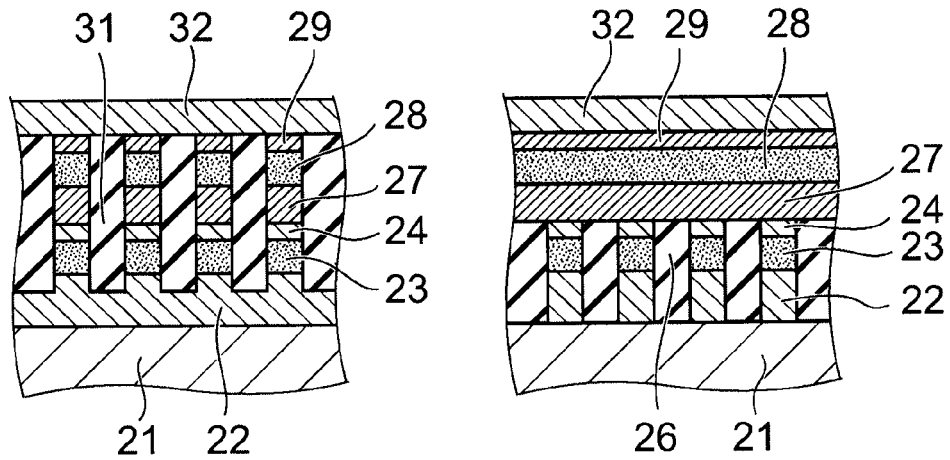

Next, as shown in FIG. 5A, a conductive layer 32 is formed on the conductive layer 29 and the interlayer insulating film 31. The conductive layer 32 is a tungsten layer and constitutes the word line WL in conjunction with the conductive layer 29.

Figure 5B:
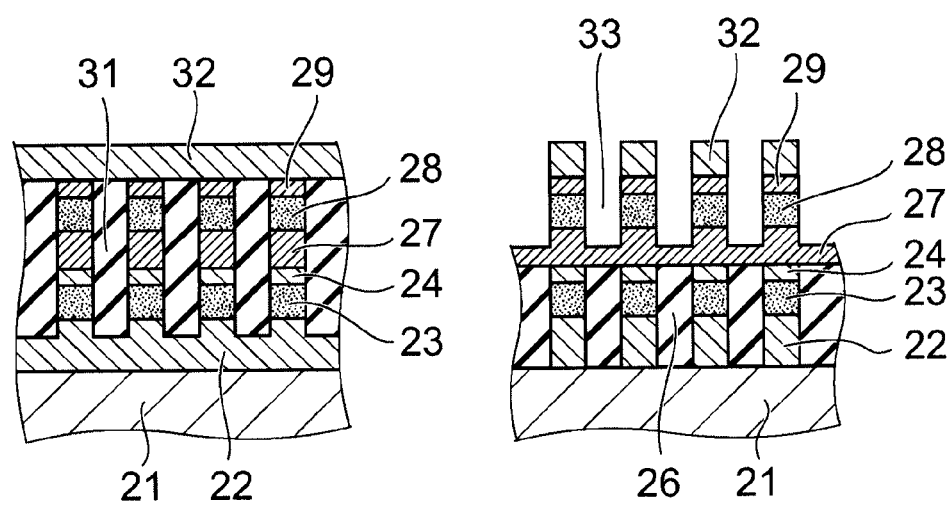

The right illustration of FIG. 5B shows a cross section cut along a plane perpendicular to the extending direction of the word line WL. As shown therein, a trench 33 is formed in the stacked body of the conductive layer 32, the conductive layer 29, the intermediate layer 28, and the conductive layer 27 by e.g. the RIE method. The trench 33 reaches the conductive layer 27, and a portion of the conductive layer 27 on the surface side is also processed. By the trench 33, the conductive layer 32 is divided into a plurality in the extending direction of the bit line BL (the extending direction of the conductive layer 27). The conductive layer 29, the intermediate layer 28, and a portion of the conductive layer 27 on the surface side are divided into a columnar shape by the trench 33.

Figure 6:
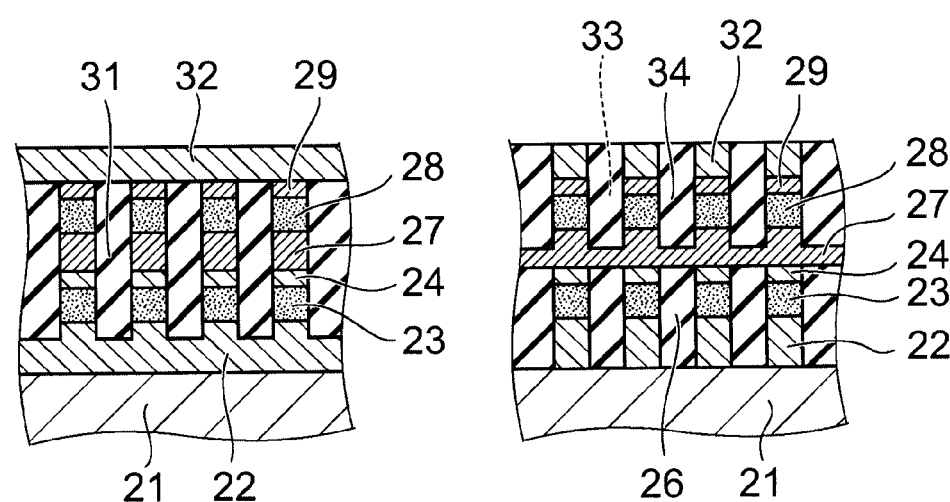

Next, as shown in the right illustration of FIG. 6, an interlayer insulating film 34 is buried in the trench 33 and planarized. Then, in the case of stacking more layers, a similar process is repeated.

In the structure shown in FIG. 6, as viewed from the foundation layer 21 side, the conductive layer 22 constitutes a first-layer of the word line WL, and the conductive layer 29 and the conductive layer 32 constitute a second-layer of the word line WL. The conductive layer 24 and the conductive layer 27 constitute a bit line BL. The word line WL and the bit line BL are alternately stacked via the intermediate layers 23 and 28 including the recording layer. The intermediate layers 23 and 28 including the recording layer is provided at the cross-point where the word line WL crosses the bit line BL.

As described above, the method for manufacturing a semiconductor device according to this embodiment includes the process of stacking a plurality of tungsten layers and patterning the tungsten layers by selective etching. Here, during etching the lower tungsten layer, the upper tungsten layer already etched may be subjected to side etching. Excessive side etching of the tungsten layer, which functions as an electrode, may lead to device characteristics variations due to variations in the shape and dimension of electrodes.

Thus, in this embodiment, as described below with reference to FIG. 7A to FIG. 8C, the side surface of the tungsten layer already processed is protected by bromization, and then the lower tungsten layer is etched. The process of FIG. 7A to FIG. 8C corresponds to the process for forming the trench shown in the right illustration of FIG. 2B, the left illustration of FIG. 4A, and the right illustration of FIG. 5B.

Figure 7A:
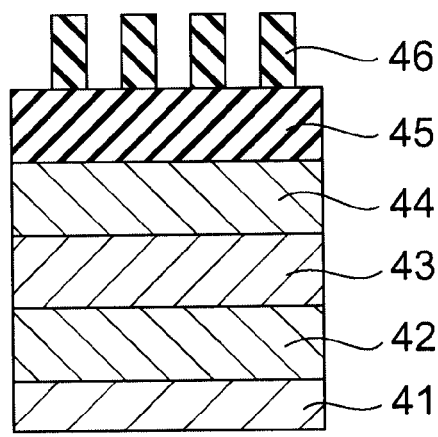

First, as shown in FIG. 7A, a first conductive layer 42, an intermediate layer 43, and a second conductive layer 44 are sequentially formed on a foundation layer 41. These are formed by e.g. the chemical vapor deposition (CVD) method or physical vapor deposition (PVD) method.

The first conductive layer 42 and the second conductive layer 44 are tungsten layers, each constituting a word line WL or a bit line BL in the memory device described above. The intermediate layer 43 corresponds to the stacked structure 17 including the recording layer 13 and the rectifying element 16.

Subsequently, an insulating film 45 made of e.g. tetraethoxysilane (TEOS) and serving as an etching mask is formed on the second conductive layer 44. Furthermore, a resist 46 is formed on the insulating film 45 and patterned.

Figure 7B:
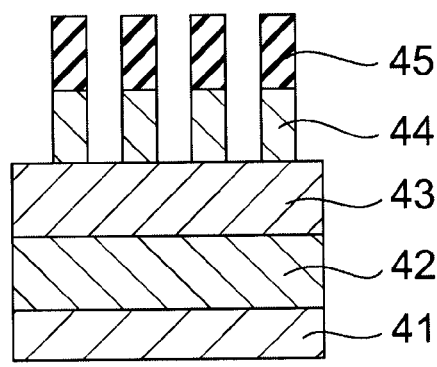

Next, the resist 46 is used as a mask to process the insulating film 45 by the RIE method. Subsequently, the resist 46 is removed by e.g. a plasma treatment with oxygen gas. As shown in FIG. 7B, the remaining insulating film 45 is used as a mask to process the second conductive layer 44 by the RIE method.

The second conductive layer 44 is etched in a processing chamber in which, e.g., a gas containing fluorine (F) (such as $NF_3$ gas or $SF_6$ gas) and Ar gas are introduced and plasma is excited. Removal of tungsten (W) due primarily to chemical interaction with fluorine (F) predominates. Furthermore, for instance, a radio frequency power as bias power can be applied to the foundation layer 41 side. Then, the second conductive layer 44 is etched also by sputter etching with Ar ions accelerated toward the foundation layer 41 side. The foundation layer 41 and the stacked body thereon are held in wafer state by a holder in the processing chamber, and the bias power is applied to the holder.

Figure 7C:
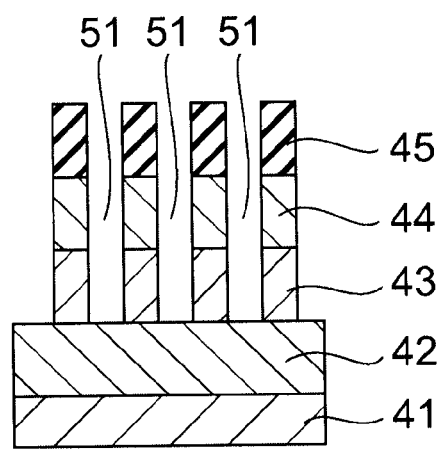

Subsequently, in the same processing chamber, RIE is performed on the intermediate layer 43 under a different etching condition for the introduced gas species, pressure, and electrical power. For instance, if the intermediate layer 43 is made of polycrystalline silicon, then a gas such as HBr gas and $Cl_2$ gas can be used. Thus, as shown in FIG. 7C, a trench 51 is formed, which penetrates through the second conductive layer 44 and the intermediate layer 43 to the surface of the first conductive layer 42. In this stage, the first conductive layer 42 is not processed. Hence, the trench 51 has not reached the foundation layer 41.

Next, the deposit deposited on the side surface of the second conductive layer 44 during etching for forming the trench 51 is removed. This is intended to prevent the deposit on the side surface of the second conductive layer 44 from inhibiting the bromization of tungsten described below. For instance, $Cl_2$ gas or $CF_4$ gas is used to remove the deposit on the side surface of the second conductive layer 44.

Figure 8A:
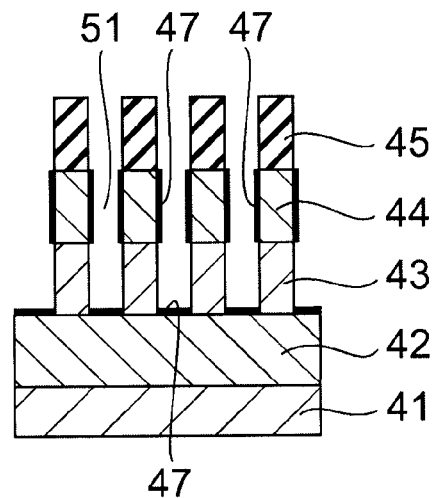

Next, a bromine-containing gas (e.g., HBr gas) is introduced into the processing chamber to generate plasma and bromize tungsten. Thus, as shown in FIG. 8A, a protective film 47 including a compound (WBrx) of tungsten (W) and bromine (Br) is formed on the side surface of the second conductive layer 44 and the upper surface of the first conductive layer 42 (the bottom surface of the trench 51) exposed to the inside of the trench 51.

Figure 8B:
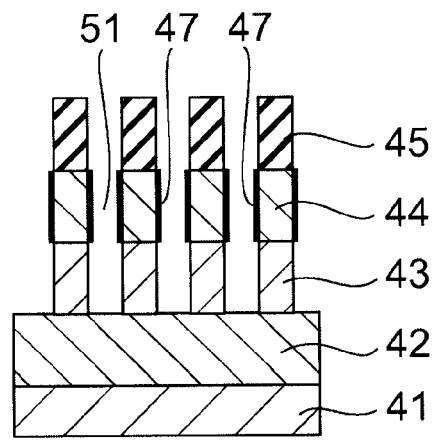

This protective film 47 protects the side surface of the second conductive layer 44 already processed. In this state, the unprocessed first conductive layer 42 is etched. The protective film 47 formed on the upper surface of the first conductive layer 42 (the bottom surface of the trench 51) inhibits etching of the first conductive layer 42. Hence, before etching the first conductive layer 42, the protective film 47 on the upper surface is removed as shown in FIG. 8B.

For instance, a gas of relatively heavy atoms, such as Ar, is added to a gas containing Cl or F (such as $Cl_2$ gas, $BCl_3$ gas, or $CF_4$ gas). Then, a bias power (radio frequency power) of e.g. 200 W or more is applied to the foundation layer 41 side to perform anisotropic etching with enhanced sputtering action on the bottom surface of the trench 51.

Thus, while suppressing side etching of the protective film 47 on the side surface of the second conductive layer 44, the protective film 47 on the bottom surface of the trench 51 can be reliably removed. At this time, if the gas pressure in the processing chamber is too high, laterally scattering active species, ions, and the like increase and may accelerate side etching of the protective film 47 formed on the side surface of the second conductive layer 44. Hence, at removing the protective film 47 on the bottom surface of the trench 51, the gas pressure in the processing chamber is preferably made lower than at forming the protective film 47.

To suppress side etching of the protective film 47 on the side surface of the second conductive layer 44, it is preferable that the time required to remove the protective film 47 on the bottom surface of the trench 51 be shorter. Hence, it is preferable that the protective film 47 formed on the bottom surface of the trench 51 be thinner. When the protective film 47 is formed, if the bias power applied to the foundation layer 41 side is high, the protective film 47 is thickly formed on the bottom surface of the trench 51. Hence, it is preferable that no bias power, or a lowest possible bias power, if any, be applied to the foundation layer 41 side. That is, when the protective film 47 is formed, the foundation layer 41 side is grounded, or applied with a lower power than at removing the protective film 47 on the bottom surface of the trench 51.

After removing the protective film 47 on the bottom surface of the trench 51, with the protective film 47 formed on the side surface of the second conductive layer 44, RIE is performed on the first conductive layer 42 below the trench 51. The condition at this time is the same as that in etching the second conductive layer 44. For instance, a gas containing fluorine (F) is used to etch the first conductive layer 42 including tungsten (W).

Here, the protective film 47 formed on the side surface of the second conductive layer 44 includes a compound $WBr_x$ of tungsten (W) and bromine (Br). This compound $WBr_x$ is highly resistant to fluorine. Furthermore, tungsten (W) on the side surface of the second conductive layer 44 is coupled to bromine (Br). Hence, reaction of tungsten (W) and fluorine (F) can be suppressed on the side surface of the second conductive layer 44. Consequently, side etching of the side surface of the second conductive layer 44 can be suppressed.

Figure 8C:
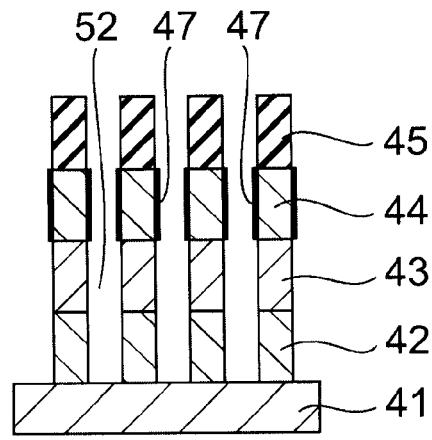

As the result of the above process, as shown in FIG. 8C, a trench 52 is formed, which penetrates through the second conductive layer 44, the intermediate layer 43, and the first conductive layer 42 to the foundation layer 41. That is, the stacked body of the second conductive layer 44, the intermediate layer 43, and the first conductive layer 42 is divided into a plurality by the trench 52 on the foundation layer 41.

The processing of the insulating film 45, the second conductive layer 44, the intermediate layer 43, and the first conductive layer 42, the formation of the protective film 47, and the removal of the protective film 47 on the bottom surface of the trench 51 described above, are continuously performed in the same processing chamber under a reduced pressure without takeout from this processing chamber, while switching the condition for the gas species introduced into the processing chamber, the amount of the introduced gas, pressure, and electrical power.

A stacked body including three or more tungsten layers can also be processed by repeating the step for processing the upper tungsten layer, the step for forming the aforementioned protective film 47 on the side surface of the tungsten layer already processed, and the step for processing the lower tungsten layer with the protective film 47 formed on the side surface of the tungsten layer already processed. Thus, a plurality of tungsten layers can be processed while suppressing side etching of the upper tungsten layer already processed.

Here, as an alternative method, it may be contemplated to add a Br-containing gas to the raw material gas so that the side surface of the tungsten layer is bromized during etching. However, in this case, removal of tungsten proceeds simultaneously. Hence, reliable protection of the tungsten layer is not promising. Furthermore, it is difficult to determine the condition for achieving compatibility between etching and protection of the tungsten layer. Because the processing is performed under the condition intended not only for the formation of the protective film, the side surface of the tungsten layer is excessively bromized depending on the condition. This causes concern about the degradation of the processed shape and dimension of the tungsten layer.

In contrast, in this embodiment, the protective film 47 is formed under the condition (such as gas species, gas flow rate, and electrical power) different from that at etching the tungsten layer (the first conductive layer 42 and the second conductive layer 44). That is, the formation of the protective film 47 is performed as a step independent of the step for etching the tungsten layer. Thus, the side surface of the tungsten layer already processed can be reliably bromized. Furthermore, while suppressing excessive increase of the film thickness, a thin and robust protective film 47 can be formed. Consequently, the control of the processed shape and dimension of the tungsten layer can be easily made compatible with the protection against side etching. Improved controllability of the processed shape and dimension of the tungsten layer suppresses device characteristics variations.

Next, with reference to FIG. 9A to FIG. 10C, another example of the method for processing the tungsten layer is described.

Figure 9A:
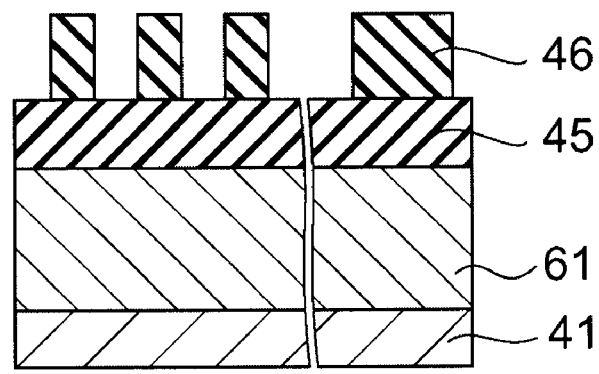

First, as shown in FIG. 9A, a conductive layer 61 made of a tungsten layer is formed on a foundation layer 41 by the CVD method or PVD method. Subsequently, an insulating film 45 made of e.g. TEOS and the like and serving as an etching mask is formed on the conductive layer 61. Furthermore, a resist 46 is formed on the insulating film 45 and patterned.

Figure 9B:
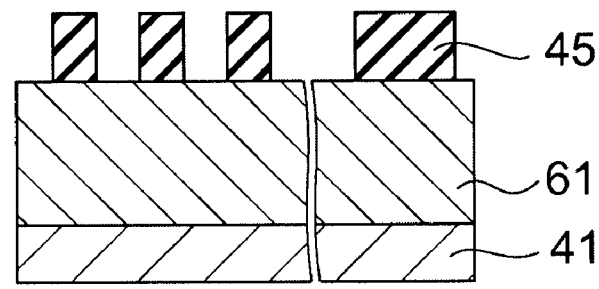
Figure 9C:
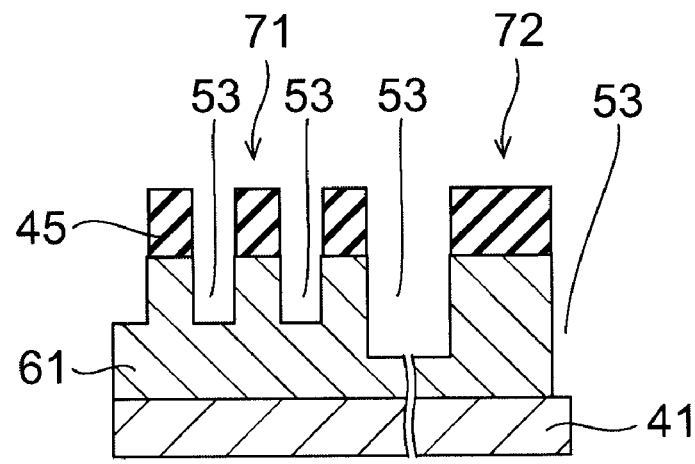

Next, the resist 46 is used as a mask to process the insulating film 45 by the RIE method. Subsequently, the resist 46 is removed by e.g. plasma treatment with oxygen gas (FIG. 9B). As shown in FIG. 9C, the remaining insulating film 45 is used as a mask to process the conductive layer 61 by the RIE method. Thus, a trench 53 is formed.

The conductive layer 61 is etched in a processing chamber in which, e.g., a gas containing fluorine (F) (such as $NF_3$ gas or $SF_6$ gas) and Ar gas are introduced and plasma is excited. Removal of tungsten (W) due primarily to chemical interaction with fluorine (F) predominates. Furthermore, for instance, a radio frequency power as bias power can be applied to the foundation layer 41 side. Then, the conductive layer 61 is etched also by sputter etching with Ar ions accelerated toward the foundation layer 41 side. The foundation layer 41 and the stacked body thereon are held in wafer state by a holder in the processing chamber, and the bias power is applied to the holder.

In this embodiment, it is assumed that the conductive layer 61 includes a dense portion 71 and a sparse portion (or isolated portion) 72 in a mixed manner in the in-plane direction of the wafer. In the dense portion 71, the conductive layer 61 is processed relatively densely into a protrusion-depression pattern. In the sparse portion 72, the processed conductive layer 61 exists relatively sparsely or in an isolated manner.

In etching tungsten, the microloading effect tends to occur relatively significantly. Thus, if the dense portion 71 and the sparse portion 72 are etched simultaneously, tungsten in the sparse portion 72 is etched more rapidly. That is, at the time when the trench 53 formed in the sparse portion 72 reaches the foundation layer 41, the trench 53 formed in the dense portion 71 may have yet to reach the foundation layer 41. Then, if the etching is continued as is, excessive side etching occurs at the side surface of the conductive layer 61 already processed in the sparse portion 72.

Here, it may be contemplated to increase the gas as a source for generating the deposit deposited on the side surface of the conductive layer 61 during etching to suppress side etching in the sparse portion 72. However, in this case, the deposit is excessively deposited on the side surface of the conductive layer 61 in the dense portion 71, and degrades the shape and dimension. Hence, in processing the tungsten layer, it is difficult to simultaneously process the dense portion 71 and the sparse portion 72 with good shape controllability.

Thus, in this embodiment, at the time when the trench 53 in the sparse portion 72 reaches the foundation layer 41, etching of the conductive layer 61 is temporarily stopped, and switched to the step for forming a protective film by switching the gas species, electrical power and the like.

Figure 10A:
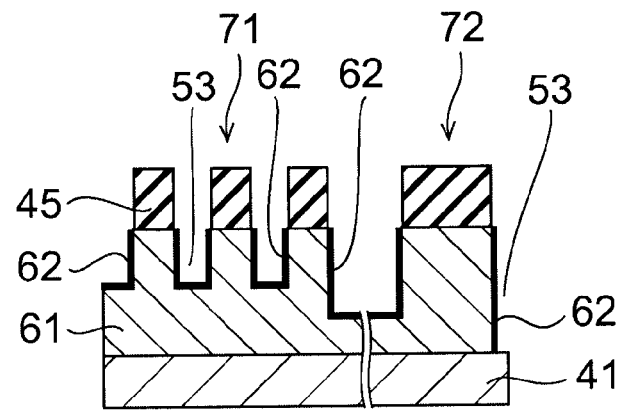
Figure 10B:
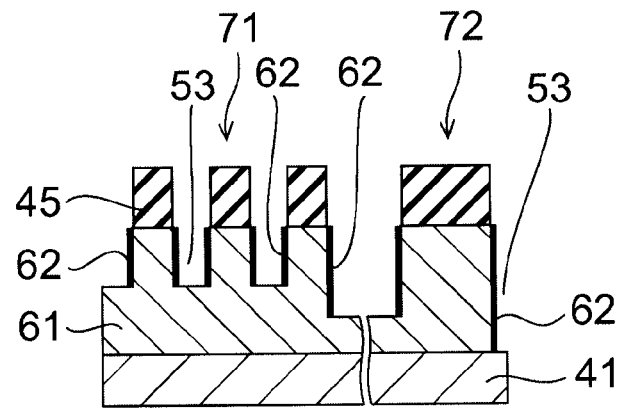

Specifically, similar to the aforementioned embodiment, a bromine-containing gas (e.g., HBr gas) is introduced into the processing chamber to generate plasma and bromize tungsten. Thus, as shown in FIG. 10A, a protective film 62 including a compound (WBrx) of tungsten (W) and bromine (Br) is formed on the side surface and bottom surface of the trench 53. Here, in this embodiment as well, before forming the protective film 62, a process for removing the deposit deposited on the side surface of the conductive layer 61 at forming the trench 53 may be performed.

The protective film 62 formed on the bottom surface of the trench 53 inhibits etching of the conductive layer 61 remaining below the trench 53 in the dense portion 71, and hence is removed as shown in FIG. 10B before again etching the conductive layer 61.

For instance, a gas of relatively heavy atoms, such as Ar, is added to a gas containing Cl or F (such as $Cl_2$ gas, $BCl_3$ gas, or $CF_4$ gas). Then, a bias power (radio frequency power) of e.g. 200 W or more is applied to the foundation layer 41 side to perform anisotropic etching with enhanced sputtering action on the bottom surface of the trench 53.

Thus, while suppressing side etching of the protective film 62 formed on the side surface of the trench 53, i.e., the side surface of the conductive layer 61, the protective film 62 on the bottom surface of the trench 53 can be reliably removed. At this time, if the gas pressure in the processing chamber is too high, laterally scattering active species, ions, and the like increase and may accelerate side etching of the protective film 62 formed on the side surface of the conductive layer 61. Hence, at removing the protective film 62 on the bottom surface of the trench 53, the gas pressure in the processing chamber is preferably made lower than at forming the protective film 62.

It is preferable that the time required to remove the protective film 62 on the bottom surface of the trench 53 be shorter to suppress side etching of the protective film 62 on the side surface of the conductive layer 61. Hence, it is preferable that the protective film 62 formed on the bottom surface of the trench 53 be thinner. When the protective film 62 is formed, if the bias power applied to the foundation layer 41 side is high, the protective film 62 is thickly formed on the bottom surface of the trench 53. Hence, it is preferable that no bias power, or a lowest possible bias power, if any, be applied to the foundation layer 41 side. That is, when the protective film 62 is formed, the foundation layer 41 side is grounded, or a lower power than at removing the protective film 62 on the bottom surface of the trench 53 is applied.

After removing the protective film 62 on the bottom surface of the trench 53, with the protective film 62 formed on the side surface of the already processed conductive layer 61, RIE is performed on the conductive layer 61 still remaining below the trench 53. The condition at this time is the same as that in the previous etching of the conductive layer 61. For instance, a gas containing fluorine (F) is used to etch the conductive layer 61 including tungsten (W).

Here, the protective film 62 formed on the side surface of the conductive layer 61 includes a compound WBrx of tungsten (W) and bromine (Br). This compound WBrx is highly resistant to fluorine. Furthermore, tungsten (W) on the side surface of the conductive layer 61 is coupled to bromine (Br). Hence, reaction of tungsten (W) and fluorine (F) can be suppressed on the side surface of the conductive layer 61. Consequently, side etching of the side surface of the conductive layer 61 can be suppressed.

Figure 10C:
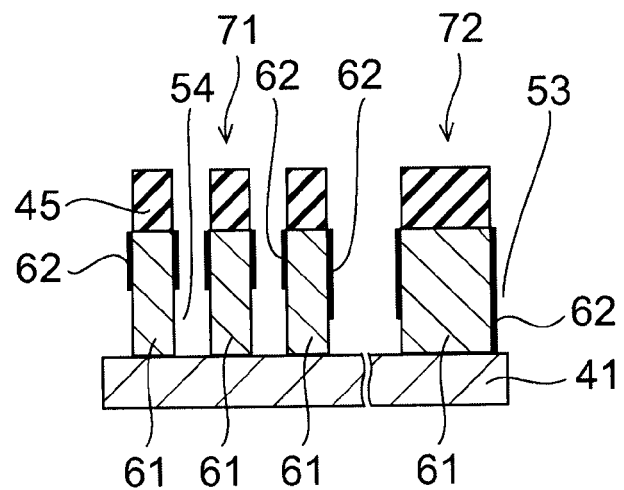

As the result of the above process, as shown in FIG. 10C, a trench 54 is formed, which penetrates through the conductive layer 61 in the dense portion 71 and the sparse portion 72 to the foundation layer 41. That is, the conductive layer 61 is divided into a plurality by the trench 54 on the foundation layer 41.

According to this embodiment, the conductive layer 61 in the dense portion 71 can be reliably processed while suppressing side etching of the conductive layer 61 in the sparse portion 72, where etching proceeds relatively rapidly. Consequently, the processed shape and dimension of the conductive layer 61 can be favorably controlled both in the dense portion 71 and the sparse portion 72.

Also in this embodiment, the processing of the insulating film 45 and the conductive layer 61, the formation of the protective film 62, and the removal of the protective film 62 on the bottom surface of the trench 53 described above are continuously performed in the same processing chamber under a reduced pressure without takeout from this processing chamber, while switching the condition for the gas species introduced into the processing chamber, the amount of the introduced gas, pressure, and electrical power.

Furthermore, the protective film 62 is formed in a step independent of the step for etching the conductive layer 61, under the condition (such as gas species, gas flow rate, and electrical power) different from that at etching the conductive layer 61. Thus, the side surface of the conductive layer 61 already processed can be reliably bromized. Furthermore, while suppressing excessive increase of the film thickness, a thin and robust protective film 62 can be formed. Consequently, the control of the processed shape and dimension of the conductive layer 61 can be easily made compatible with the protection against side etching. Improved controllability of the processed shape and dimension of the conductive layer 61 suppresses device characteristics variations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A method for manufacturing a semiconductor device, comprising:
    forming a conductive layer including tungsten on a foundation layer;
    forming a trench by selectively etching the conductive layer, the trench being shallower than a depth from a surface of the conductive layer to the foundation layer;
    after the forming of the trench, forming a protective film on a side surface and a bottom surface of the conductive layer in the trench using a gas containing bromine, the protective film including a compound of the tungsten and the bromine;
    removing the protective film on the bottom surface of the conductive layer; and
    after the removing of the protective film on the bottom surface of the conductive layer, etching a portion of the conductive layer below the trench with the protective film on the side surface of the conductive layer.

2. The method according to claim 1, wherein an electrical power is applied to the foundation layer side at the removing of the protective film on the bottom surface.

3. The method according to claim 2, wherein the protective film on the bottom surface is removed by sputtering using a gas containing Ar.

4. The method according to claim 1, wherein gas pressure in a processing chamber at the removing of the protective film on the bottom surface is lower than gas pressure in the processing chamber at the forming of the protective film.

5. The method according to claim 1, wherein the foundation layer side is grounded at the forming of the protective film.

6. The method according to claim 2, wherein an electrical power lower than the electrical power at the removing of the protective film on the bottom surface is applied to the foundation layer side at the forming of the protective film.

7. The method according to claim 1, further comprising:
    before the forming of the protective film, removing a deposit deposited on the side surface of the conductive layer at the forming of the trench.

8. The method according to claim 7, wherein the deposit is removed using $Cl_2$ gas.

9. The method according to claim 7, wherein the deposit is removed using $CF_4$ gas.

10. The method according to claim 1, wherein the conductive layer is etched in a processing chamber in which a gas containing fluorine is introduced and plasma is excited.

11. The method according to claim 1, wherein the etching of the conductive layer, the forming of the protective film, and the removing of the protective film on the bottom surface are continuously performed in a same processing chamber under a reduced pressure.

12. The method according to claim 1, wherein
    the conductive layer includes a first conductive layer and a second conductive layer provided above the first conductive layer via an intermediate layer,
    the trench penetrates through the second conductive layer and the intermediate layer to the first conductive layer,
    the protective film is formed on a side surface of the second conductive layer exposed to the trench, and
    the first conductive layer below the trench is etched with the protective film on the side surface of the second conductive layer.

13. The method according to claim 12, wherein the intermediate layer includes a recording layer, a resistance of the recording layer being changed by a voltage applied through the first conductive layer and the second conductive layer.

14. The method according to claim 12, wherein the forming of the trench includes:
    etching the second conductive layer until reaching the intermediate layer; and
    etching the intermediate layer until reaching the first conductive layer, and
    the etching of the second conductive layer, the etching of the intermediate layer, and the etching of the first conductive layer below the trench are performed in a same processing chamber without takeout from the processing chamber.

15. The method according to claim 12, wherein the trench penetrating through the second conductive layer and the intermediate layer, and a second trench formed by etching the first conductive layer divide a first stacked body into a plurality in a direction crossing an extending direction of the first conductive layer, the first stacked body including the second conductive layer, the intermediate layer and the first conductive layer.

16. The method according to claim 15, further comprising:
    burying an interlayer insulating film in a trench dividing the first stacked body;
    forming a second stacked body on the first stacked body and the interlayer insulating film, the second stacked body including a third conductive layer including tungsten, a second intermediate layer provided on the third conductive layer, and a fourth conductive layer including tungsten and provided on the second intermediate layer; and
    dividing the second stacked body into a plurality in the extending direction of the first conductive layer and dividing at least the second conductive layer and the intermediate layer in the first stacked body in a columnar shape.

17. The method according to claim 1, wherein
    the conductive layer includes a dense portion and a sparse portion, a protrusion-depression pattern formed by the etching existing relatively densely in the dense portion and relatively sparsely in the sparse portion, and
    the protective film is formed when a trench formed by selectively etching the conductive layer in the sparse portion has reached the foundation layer and the trench formed in the dense portion has not reached the foundation layer.

18. The method according to claim 1, wherein the protective film is formed independently of the etching of the conductive layer with a gas species different from an etching gas species at the etching of the conductive layer.

19. The method according to claim 1, wherein the protective film is formed independently of the etching of the conductive layer with a gas flow rate different from an etching gas flow rate at the etching of the conductive layer.

20. The method according to claim 1, wherein the protective film is formed independently of the etching of the conductive layer with an electrical power applied to the foundation layer side different from an electrical power applied to the foundation layer side at the etching of the conductive layer.

* * * * *